US006133771A

United States Patent [19]

Portaluri et al.

[11] Patent Number: 6,133,771

[45] Date of Patent: Oct. 17, 2000

[54] DEVICE FOR GENERATING PULSES OF HIGH-PRECISION PROGRAMMABLE DURATION

[75] Inventors: Salvatore Portaluri, Pavia; Valerio Pisati, Bosnasco; Luigi Zangrandi, Pavia, all of Italy

[73] Assignee: STMicroelectronics S.r.l., Agrate Brianza, Italy

[21] Appl. No.: 09/263,757

[22] Filed: Mar. 5, 1999

[30] Foreign Application Priority Data

Mar. 31, 1998 [EP] European Pat. Off. .............. 98830191

[51] Int. Cl.[7] ........................ H03K 3/17

[52] U.S. Cl. ........................ 327/171; 327/172

[58] Field of Search ........................ 327/171, 172, 327/173, 174, 175, 176

[56] References Cited

U.S. PATENT DOCUMENTS

| | | | |
|---|---|---|---|
| 3,713,026 | 1/1973 | Kubo | 235/152 |
| 3,728,635 | 4/1973 | Eisenberg | 327/279 |
| 4,232,267 | 11/1980 | Hanajima et al. | 328/138 |
| 4,595,848 | 6/1986 | Ryczek | 327/393 |
| 4,663,609 | 5/1987 | Rosario | 340/72 |
| 4,968,907 | 11/1990 | Pepper | 327/286 |

FOREIGN PATENT DOCUMENTS

| | | | |
|---|---|---|---|
| 2 319 164 | 10/1974 | Germany | B61L 1/16 |

OTHER PUBLICATIONS

W. Klara, "*Single–Shot Circuit Implemented in Large–Scale Integration*," IBM Technical Disclosure Bulletin, vol. 20, No. 4, Sep. 1, 1977, p. 1458.

*Primary Examiner*—Tuan T. Lam
*Assistant Examiner*—Linh Nguyen

[57] ABSTRACT

A device generates pulses of high-precision with programmable duration. The device includes first, second and third pulse generator circuits. The first pulse generator circuit receives at an input a pulse generation command signal, and provides at an output a first pulse for loading the contents of a register in a counter. The second pulse generator circuit is triggered by the first pulse provided by the first pulse generator circuit. The third pulse generator circuit is triggered by a second pulse provided by the second pulse generator circuit, and generates a third pulse to restart the second pulse generator circuit. The second pulse provided by the second pulse generator circuit forms a clock signal for the counter to produce a decrement in the counter. The output signal from the counter is the pulsed signal to be generated. The duration of the pulsed signal is determined by the content of the counter.

18 Claims, 1 Drawing Sheet

DEVICE FOR GENERATING PULSES OF HIGH-PRECISION PROGRAMMABLE DURATION

FIELD OF THE INVENTION

The present invention relates to the field of electronics, and, more particularly, to a pulse generator.

BACKGROUND OF THE INVENTION

Pulses are conventionally characterized by waveform, duration and frequency. The waveform that the pulse must have depends on the intended applications. Some cases may require a perfectly rectangular pulse. In other cases, for example, the waveform for a trigger circuit of an oscilloscope is not important, but a pulse with short duration and a steep rising edge is necessary. It may also be necessary to generate the pulses one by one, or generate the pulses continuously at a preset frequency. Often the duration of the pulse and the repetition rate must be adjustable.

Pulse generation can occur by using differentiating circuits, multivibrator circuits, locked oscillating circuits and delay lines. The most common pulse generation circuit involves the use of preset time constants, i.e., RC circuit, RC cascades or logic gate cascades. Circuits requiring good precision use a clock, if available, or use the time required by a capacitor to charge under a constant current until a preset threshold voltage is reached. In this case, the duration of the pulse is determined by the conventional relation of $T=C*V/I$.

By choosing a fixed current and a fixed threshold voltage, pulse precision is affected only by the variations in the capacitance related to the process. A fixed current is provided, for example, by extracting a current from a band-gap voltage divided by an external resistance. A fixed threshold voltage is provided, for example, by the K* band-gap voltage. If it is possible to adjust the current to follow the capacitance variation, precision is very high by using, for example, conventional structures such as the one shown in FIG. 1. In this case, the main drawback is the difficulty in generating pulses having a relatively long duration, i.e., on the order of 20–100 microseconds within a chip. The threshold voltage V is limited to the value of the supply voltage, and it is therefore necessary to use an extremely high capacitance value C with very low values of the current I. Accordingly, precision is significantly degraded.

SUMMARY OF THE INVENTION

An object of the present invention is to provide a device for generating pulses of high-precision with programmable duration which can be synchronized with a pulse start command.

Another object of the present invention is to provide a device for generating pulses of high-precision with programmable duration without using an internal clock signal.

A further object of the present invention is to provide a device for generating pulses of high-precision with programmable duration usable in circuits for controlling the polarization of a laser in analog-digital applications in which no reference clock signal is present.

Yet another object of the present invention is to provide a device for generating pulses of high-precision with programmable duration suitable to provide programmable timers.

Another object of the present invention is to provide a device for generating pulses of high-precision with programmable duration which is very reliable, relatively easy to manufacture and at competitive costs.

These objects and others, which will become apparent hereinafter, are achieved by a device for generating pulses of high-precision programmable duration, characterized in that the device comprises first, second and third pulse generator means. A first pulse generator circuit receives at an input a pulse generation command signal, and provides at an output a first pulse for loading the contents of a register in a counter. A second pulse generator circuit is triggered by the first pulse. A third pulse generator circuit is triggered by a second pulse provided by the second pulse generator circuit, and generates a third pulse to restart the second pulse generator circuit. The second pulse emitted by the second pulse generator circuit forms a clock signal to decrement the counter. An output signal from the counter is the pulsed signal to be generated. The duration of the pulsed signal is determined by the content of the counter.

BRIEF DESCRIPTION OF THE DRAWINGS

Further characteristics and advantages of the invention will become apparent from the description of a preferred, but not exclusive, embodiment of the device according to the invention, illustrated only by way of non-limitative examples in the accompanying drawings, wherein.

DETAILED DESCRIPTION OF THE PREFERRED EMBODIMENTS

Figure 1:
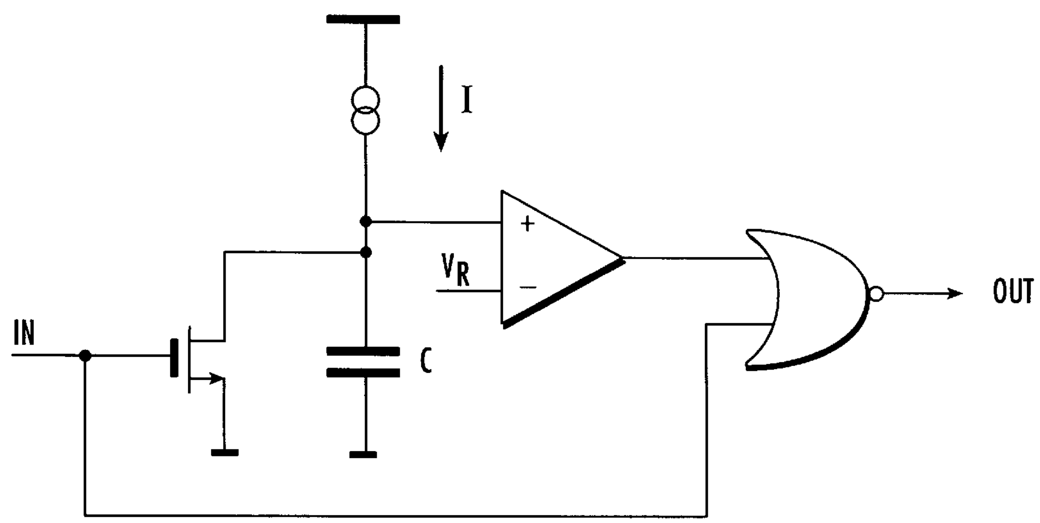
FIG. 1 is a circuit diagram of a conventional pulse generator device according to the prior art.
Figure 2:
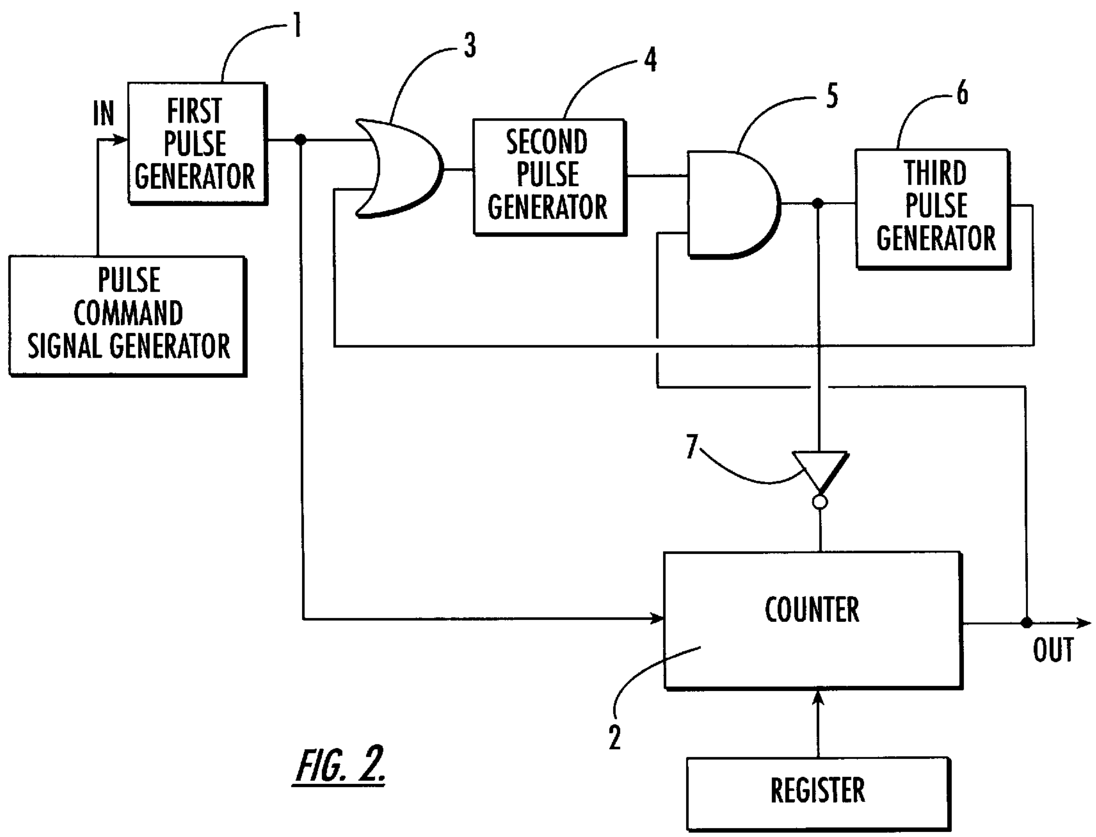
FIG. 2 is a block diagram of the pulse generator device according to the present invention.

Accordingly, FIG. 2, which shows the pulse generator device according to the present invention, illustrates a first pulse generator, designated by the reference numeral 1, in which the output is connected to a counter 2 and to a first logic circuit. The first logic circuit is advantageously provided by an OR logic gate 3. The OR logic gate 3 is connected to a second pulse generator 4, in which the output is connected to a second logic circuit. The second logic circuit is advantageously provided by an AND logic gate 5, in which the output is connected to a third pulse generator 6. The output of the third pulse generator 6 is fedback to the OR logic gate 3 and forms the second input of the OR logic gate 3. This is in addition to the input provided by the first pulse generator 1.

The output signal from the counter 2 is sent both to the output of the device as the intended pulse, and to the AND logic gate 5 which forms the second input of the AND logic gate 5. The first input of the gate is, as previously stated, the output of the second pulse generator 4. The output signal from the AND logic gate 5 is sent not only to the third pulse generator 6, but also to the counter 2 after passing through an inverter 7. The input signal to the first pulse generator 1 is a trigger signal, i.e., a signal which commands the start of the pulse, and is designated by the reference IN.

The counter 2 internally stores the content of an external register, which determines a value for multiplying the duration of the pulse generated by the second pulse generator 4. Therefore, the duration of the pulse is equal to the value loaded in the counter 2 multiplied by the duration of the pulse generated by the second pulse generator 4.

With reference now to FIG. 2, operation of the device according to the invention is as follows. The pulse generation command signal IN is applied as an input to the first pulse generator 1. The first pulse generator 1 provides a first pulse defining the signal for loading the counter 2 with the value contained in an external register. The first pulse is also sent to the first logic circuit 3, formed by the OR gate. The first pulse is used to trigger the second pulse generator 4 together with the pulse which is fedback by the third pulse generator 6.

The loading of the counter 2 sets the output to a logic value 1. This determines the start of the final pulse OUT. The output of the counter 2 ultimately forms the final pulse, designated by the reference OUT. The falling edge of the pulse generated by the second pulse generator 4 is provided as the clock signal for the counter 2, and triggers the third pulse generator 6. The third pulse generator 6 generates a short pulse (third pulse) which restarts the second pulse generator 4 by being fed to the OR logic gate 3. Operation continues with the counter 2 which decreases its content upon the arrival of each clock signal. When the value of the count reaches zero, the pulsed output signal OUT is reset. This determines the end of the pulse to be generated, and also blocks propagation of the clock signal along the circuit until a subsequent pulse generation command pulse IN arrives.

The device, according to the invention, fully achieves the intended objects because it allows generation of a pulse having a duration programmable with high precision, and without using large capacitance values with very small current values. The device is particularly suitable for use in all analog-digital applications in which a reference clock signal is not present. Moreover, the device is suitable for the production of programmable timers, and for generating a pulse for the test phase of a circuit for controlling the polarization of a laser in DVD applications.

Numerous modifications and variations can be made to the device, all of which are within the scope of the invention. Furthermore, all the details may be replaced with other technically equivalent elements. The materials used in forming the device, may be any according to requirements and to the state of the art, as long as they are compatible with the specific use.

That which is claimed is:

1. A device for generating pulses of programmable duration, the device comprising:

a counter circuit;

a first pulse generator circuit having an input for receiving a pulse generation command signal, and an output for providing a first pulse for loading data into said counter;

a second pulse generator circuit having an input for receiving the first pulse, and an output for providing a second pulse, said second pulse generator circuit being triggered by the first pulse;

a third pulse generator circuit having an input for receiving the second pulse, and an output for providing a third pulse for restarting said second pulse generator circuit, said third pulse generator being triggered by the second pulse; and the second pulse functions as a clock signal for decrementing a count of said counter circuit, a generated pulse of the device being provided at an output of said counter circuit, and a duration of the generated pulse being determined by the data loaded in said counter.

2. A device according to claim 1, further comprising a first logic circuit interposed between said first and second pulse generator circuits, said first logic circuit having a first input for receiving the first pulse, and a second input for receiving the third pulse.

3. A device according to claim 2, wherein said first logic circuit comprises an OR logic gate.

4. A device according to claim 1, further comprising a second logic circuit interposed between said second and third pulse generator circuits, said second logic circuit having a first input for receiving the second pulse, and a second input for receiving the generated pulse provided by said counter circuit.

5. A device according to claim 4, wherein said second logic circuit comprises an AND logic gate.

6. A device according to claim 4, further comprising an inverter interposed between said second logic circuit and said counter circuit.

7. A device for generating pulses of programmable duration, the device comprising:

a circuit for generating a pulse generation command signal;

a counter circuit;

a first pulse generator circuit having an input for receiving the pulse generation command signal, and an output for providing a first pulse for loading data into said counter;

a second pulse generator circuit having an input for receiving the first pulse, and an output for providing a second pulse, said second pulse generator circuit being triggered by the first pulse;

a third pulse generator circuit having an input for receiving the second pulse, and an output for providing a third pulse for restarting said second pulse generator circuit, said third pulse generator being triggered by the second pulse; and the second pulse functions as a clock signal for decrementing a count of said counter circuit, a generated pulse of the device being provided at an output of said counter circuit, and a duration of the generated pulse being determined by the data loaded in said counter.

8. A device according to claim 7, further comprising a first logic circuit interposed between said first and second pulse generator circuits, said first logic circuit having a first input for receiving the first pulse, and a second input for receiving the third pulse.

9. A device according to claim 8, wherein said first logic circuit comprises an OR logic gate.

10. A device according to claim 7, further comprising a second logic circuit interposed between said second and third pulse generator circuits, said second logic circuit having a first input for receiving the second pulse, and a second input for receiving the generated pulse provided by said counter circuit.

11. A device according to claim 10, wherein said second logic circuit comprises an AND logic gate.

12. A device according to claim 10, further comprising an inverter interposed between said second logic circuit and said counter circuit.

13. A method for generating pulses of programmable duration, the method comprising the steps of:

triggering a first pulse generator circuit for generating a first pulse for loading data into a counter circuit; triggering a second pulse generator circuit using the first pulse for generating a second pulse which functions as a clock signal for the counter circuit;

decrementing a count of the counter circuit responsive to the counter circuit receiving the second pulse; and activating a third pulse generator circuit with the second pulse, the third pulse generator circuit for generating a third pulse for restarting the second pulse generator circuit; and providing a generated pulse at an output of the counter circuit, a duration of the generated pulse being determined by the content of the data loaded into the counter circuit.

14. A method according to claim 13, wherein the first pulse generator circuit is triggered responsive to receiving at an input a pulse generation command signal.

15. A method according to claim 14, further comprising the steps of decrementing down to zero the count each time the counter circuit receives the second pulse; and resetting the counter circuit for determining an end of the generated pulse; and blocking propagation of the second pulse until a new pulse generation command signal is received.

16. A method according to claim 13, further comprising a first logic circuit interposed between the first and second pulse generator circuits; the first logic circuit receiving at a first input the first pulse and receiving at a second input the second pulse.

17. A method according to claim 13, further comprising a second logic circuit interposed between the second and third pulse generator circuits; the second logic circuit receiving at a first input the second pulse and receiving at a second input the generated pulse, and an output for providing the second pulse.

18. A method according to claim 13, further comprising the step of inverting the second pulse which functions as a clock signal for the counter circuit.

* * * * *